（12）United States Patent
Lee et al.

(10) Patent No.: US 9,337,169 B2
(45) Date of Patent: *May 10, 2016

(54) ENVIRONMENTALLY-ASSISTED TECHNIQUE FOR TRANSFERRING DEVICES ONTO NON-CONVENTIONAL SUBSTRATES

(71) Applicant: The Board of Trustees of the Leland Stanford Junior University, Palo Alto, CA (US)

(72) Inventors: Chi-Hwan Lee, Stanford, CA (US); Dong Rip Kim, Palo Alto, CA (US); Xiaolin Zheng, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/340,425

(22) Filed: Jul. 24, 2014

(65) Prior Publication Data

US 2014/0335678 A1    Nov. 13, 2014

Related U.S. Application Data

(63) Continuation of application No. 13/791,214, filed on Mar. 8, 2013, now Pat. No. 8,815,707.

(60) Provisional application No. 61/662,846, filed on Jun. 21, 2012.

(51) Int. Cl.
*H01L 31/18* (2006.01)
*H01L 23/31* (2006.01)
*H01L 23/00* (2006.01)
(Continued)

(52) U.S. Cl.
CPC ............ *H01L 24/98* (2013.01); *H01L 21/7806* (2013.01); *H01L 24/03* (2013.01); *H01L 31/1896* (2013.01); *H01L 2924/12033* (2013.01); *H01L 2924/1306* (2013.01); *H01L 2924/351* (2013.01)

(58) Field of Classification Search
CPC ............ H01L 21/6835; H01L 31/0392; H01L 31/1892
See application file for complete search history.

(56) References Cited

U.S. PATENT DOCUMENTS 8,236,672 B2 *  8/2012  Chinone  ............. H01L 21/0242
                                                        257/103
2008/0036065 A1  2/2008  Brunnbauer et al.
2008/0315901 A1  12/2008  Inoue et al.
(Continued)

OTHER PUBLICATIONS

Seung-Yeop, K. & Dauskardt, R. H. Moisture-assisted subcritical debonding of a polymer/metal interface. Journal of Applied Physics 91, 1293-303 (2002).*

(Continued)

*Primary Examiner* — Victor A Mandala
*Assistant Examiner* — Regan J Rundio
(74) *Attorney, Agent, or Firm* — Foley & Lardner LLP; Cliff Z. Liu

(57) ABSTRACT

A device fabrication method includes: (1) providing a growth substrate including an oxide layer; (2) forming a metal layer over the oxide layer; (3) forming a stack of device layers over the metal layer; (4) performing fluid-assisted interfacial debonding of the metal layer to separate the stack of device layers and the metal layer from the growth substrate; and (5) affixing the stack of device layers to a target substrate.

21 Claims, 13 Drawing Sheets

(51) Int. Cl.
*B05D 5/00* (2006.01)
*H01L 21/78* (2006.01)

(56) References Cited

U.S. PATENT DOCUMENTS

2009/0001604 A1 1/2009 Tanaka et al.
2010/0124795 A1* 5/2010 Eguchi et al. ............ 438/29
2011/0212577 A1 9/2011 Hebert

OTHER PUBLICATIONS

J. C. Card, R. M. Cannon, E. Saiz, A. P. Tomsia, and R. O. Ritchie. On the physics of moisture-induced cracking in metal-glass (copper-silica) interfaces. Journal of Applied Physics 102, 053516 (2007); doi: 10.1063/1.2775998.*

Bergeron, Louis, "Nanowire Electronics That Can Be Shaped to Fit Any Surface and Attach to Any Material Developed at Stanford", Stanford Report, http://news.stanford.edu/news/2011/july/flexible-nanowire-electronics-072811[Sep. 15, 2011 2:22:37 PM] Jul. 28, 2011.

Kim et al., "Stretchable and Foldable Silicon Integrated Circuits", Science, 320, 5875 (2008), pp. 507-511.

Kook et al., "Moisture-Assisted Subcritical Debonding of a Polymer/Metal Interface", J. Appl. Phys., 91, 1293 (2002).

Lee et al., "Fabrication of Nanowire Electronics on Nonconventional Substrates by Water-Assisted Transfer Printing Method", Nano Lett., 11, (2011), pp. 3435-3439.

Lee et al., "Peel-and-Stick: Fabricating Thin Film Solar Cell on Universal Substrates", Scientific Reports, 2:1000, (2012), pp. 1-4.

Lee et al., "Peel-and-Stick: Mechanism Study for Efficient Fabrication of Flexible/Transparent Thin-film Electronics", Scientific Reports, 3:2917, (2013), pp. 1-6.

Lee et al., "Wafer-Scale Synthesis and Transfer of Graphene Films", Nano Lett., 10, (2010) pp. 490-493.

Yoon et al., "Ultrathin Silicon Solar Microcells for Semitransparent, Mechanically Flexible and Microconcentrator Module Designs", Nature Materials, 7 (2008) pp. 907-915.

* cited by examiner

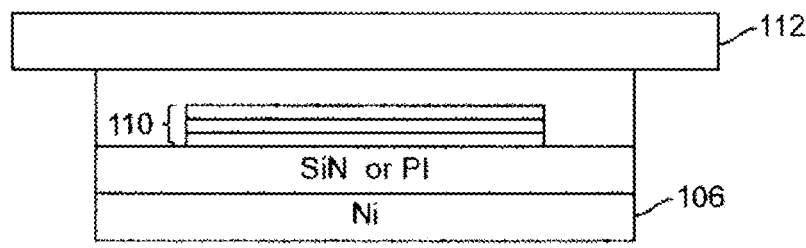
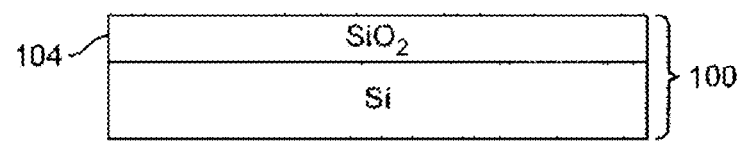
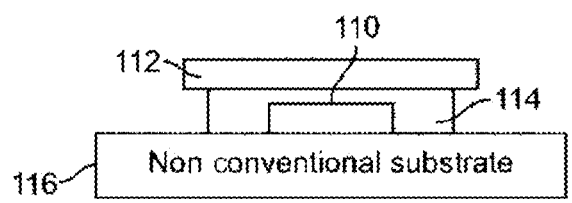
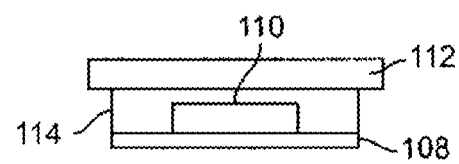
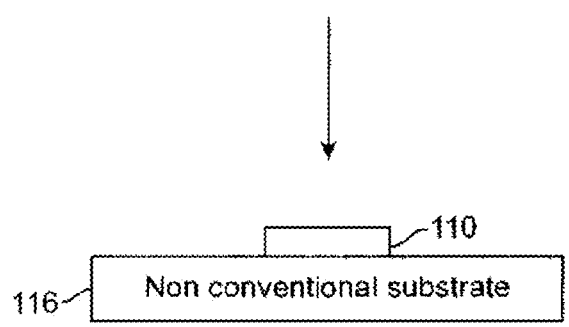
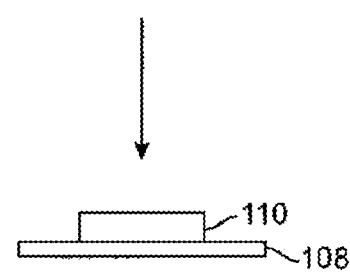
FIG. 1(e)    FIG. 1(f)

Table

| | As-fabricated (Original Si wafer) | | After peel-and-stick (Glass) | |
|---|---|---|---|---|
| Solar cell area (cm$^2$) | 0.05 | 0.28 | 0.05 | 0.28 |
| $J_{SC}$ (mA/cm$^2$) | 13.9 ± 1.0 | 10.8 ± 0.3 | 14.1 ± 1.0 | 11.0 ± 0.3 |
| $V_{OC}$ (V) | 0.848 ± 0.005 | 0.848 ± 0.005 | 0.851 ± 0.005 | 0.850 ± 0.005 |
| FF (%) | 62.8 ± 2.4 | 56.5 ± 0.9 | 63.6 ± 2.3 | 56.6 ± 1.9 |
| η (%) | 7.4 ± 0.5 | 5.2 ± 0.1 | 7.6 ± 0.5 | 5.3 ± 0.1 |

ENVIRONMENTALLY-ASSISTED TECHNIQUE FOR TRANSFERRING DEVICES ONTO NON-CONVENTIONAL SUBSTRATES

CROSS-REFERENCE TO RELATED APPLICATIONS

This application is a continuation of U.S. patent application Ser. No. 13/791,214 filed on Mar. 8, 2013, which claims the benefit of U.S. Provisional Application Ser. No. 61/662,846 filed on Jun. 21, 2012, the disclosures of which are incorporated herein by reference in their entirety.

STATEMENT REGARDING FEDERALLY SPONSORED RESEARCH OR DEVELOPMENT

This invention was made with Government support under contract 0826003 awarded by the National Science Foundation and under contract DE-SC0001060 awarded by the Department of Energy. The Government has certain rights in this invention.

FIELD OF THE INVENTION

The invention generally relates to the fabrication of electronic, optoelectronic, and magnetic devices and, more particularly, to the fabrication of such devices using an environmentally-assisted transfer technique.

BACKGROUND

It is desirable to fabricate devices, such as electronic, optoelectronic, and magnetic devices, on non-conventional substrates. Devices can be fabricated on a conventional substrate using conventional facilities and processes, and then transferred to a non-conventional substrate. Transfer techniques are of interest because it can be difficult to directly fabricate devices on non-conventional substrates. However, existing transfer techniques suffer from practical difficulties, including poor yield and area size restrictions.

It is against this background that a need arose to develop the fabrication methods and related devices described herein.

SUMMARY

One aspect of the disclosure relates to a device fabrication method. In one embodiment, the device fabrication method includes: (1) providing a growth substrate including an oxide layer; (2) forming a metal layer over the oxide layer; (3) forming a stack of device layers over the metal layer; (4) performing fluid-assisted interfacial debonding of the metal layer to separate the stack of device layers and the metal layer from the growth substrate; and (5) affixing the stack of device layers to a target substrate.

In another embodiment, the device fabrication method includes: (1) providing a growth substrate including an oxide layer; (2) forming a metal layer over the oxide layer; (3) forming a support layer over the metal layer; (4) forming a stack of device layers over the support layer; and (5) performing fluid-assisted interfacial debonding of the metal layer to separate the stack of device layers, the support layer, and the metal layer from the growth substrate.

Another aspect of the disclosure relates to an electronic, an optoelectronic, or a magnetic device. In one embodiment, the device is formed by: (1) providing a growth substrate including an oxide layer; (2) forming a metal layer over the oxide layer; (3) forming a stack of device layers over the metal layer; (4) performing fluid-assisted interfacial debonding of the metal layer to separate the stack of device layers and the metal layer from the growth substrate; and (5) affixing the stack of device layers to a target substrate.

In another embodiment, the device is formed by: (1) providing a growth substrate including an oxide layer; (2) forming a metal layer over the oxide layer; (3) forming a support layer over the metal layer; (4) forming a stack of device layers over the support layer; and (5) performing fluid-assisted interfacial debonding of the metal layer to separate the stack of device layers, the support layer, and the metal layer from the growth substrate.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Embodiments of the disclosure relate to an improved device transfer technique. The transfer technique allows the fabrication of devices on conventional substrates, and the subsequent transfer of the fully fabricated devices to non-conventional substrates, such as paper, plastics, tapes, textiles, glasses, poly(dimethylsiloxane) substrates, metal foils, and ultrathin polymer substrates. The resulting devices can be broadly applicable to various technologies, such as flexible displays, paper electronics, portable power supplies, conformal sensors, wearable electronics, aerospace applications, and so forth.

Certain embodiments of the transfer technique leverage environmentally-assisted separation of layers at an interface between the layers to facilitate device transfer. In some embodiments, the separation relies on the phenomenon of environmentally-assisted subcritical interfacial debonding. One example of environmentally-assisted interfacial debonding is water-assisted interfacial debonding at an interface between a metal layer and an oxide layer. The use of water to achieve debonding provides a number of advantages, such as low cost, little or no toxicity, non-corrosive environments, and so forth. However, it is contemplated that environmentally-assisted interfacial debonding can be performed using other debonding agents as a fluid or in a solution form, such as a pH buffer solution, a mildly corrosive solution, an oxidizer (e.g., hydrogen peroxide), and so forth.

FIG. 1 is an illustration of a sequence of operations of a device fabrication method of an embodiment of the disclosure. For ease of illustration, the operations focus on the fabrication and transfer of one device, although it is contemplated that similar operations can be carried out on multiple devices in parallel, such as in the form of an array of devices.

Figure 1A:
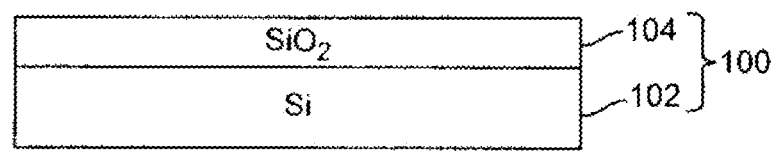
FIG. 1: (a), (b), (c), (d), (e), and (f): Illustration of a sequence of operations of a device fabrication method.

Referring first to FIG. 1(a), a growth substrate 100 is provided, including a base 102 and an oxide layer 104 that is disposed over the base 102. In the illustrated embodiment, the base 102 is a silicon base, such as a silicon wafer, and the oxide layer 104 is a silicon oxide layer. The base 102 can be formed of other materials, including other conventional substrate materials such as gallium arsenide or another semiconductor material, as well as flexible substrate materials for roll-to-roll manufacturing systems such as stainless steel and other metal foils. Also, another oxide can be included in place of, or in combination, with silicon oxide.

Figure 1B:
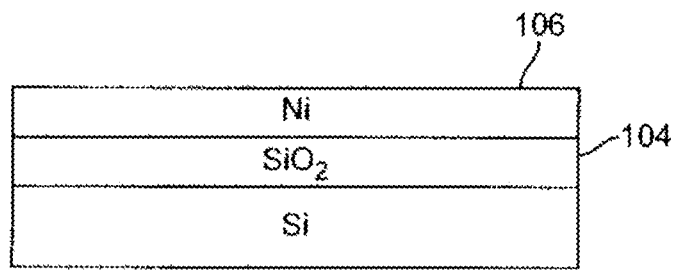

Next, referring to FIG. 1(b), a metal layer 106 is formed over the oxide layer 104. In the illustrated embodiment, the metal layer 106 is formed of a ductile metal or a combination or alloy of ductile metals, such as nickel, copper, aluminum, gold, and other metals having a percentage elongation at break of at least about 8%, such as at least about 10%, at least about 15%, at least about 20%, at least about 25%, at least about 30%, at least about 35%, at least about 40%, or at least about 45%, and up to about 50% or more. Without wishing to be bound by a particular theory, the ductility of the metal layer 106 can facilitate penetration of a debonding agent, such as water, along an interface between the metal layer 106 and the oxide layer 104. Also, the metal layer 106 can react with the oxide layer 104, such that, when exposed to water or another debonding agent, the interface becomes hydrophilic to further facilitate the penetration of the debonding agent. The metal layer 106 can be formed by electron-beam evaporation or another suitable deposition technique, and a thickness of the metal layer 106 can be in a range of about 1 nm to about 10 μm, such as from about 10 nm to about 1 μm, from about 100 nm to about 900 nm, from about 100 nm to about 700 nm, from about 100 nm to about 500 nm, or from about 200 nm to about 400 nm.

Figure 1C:
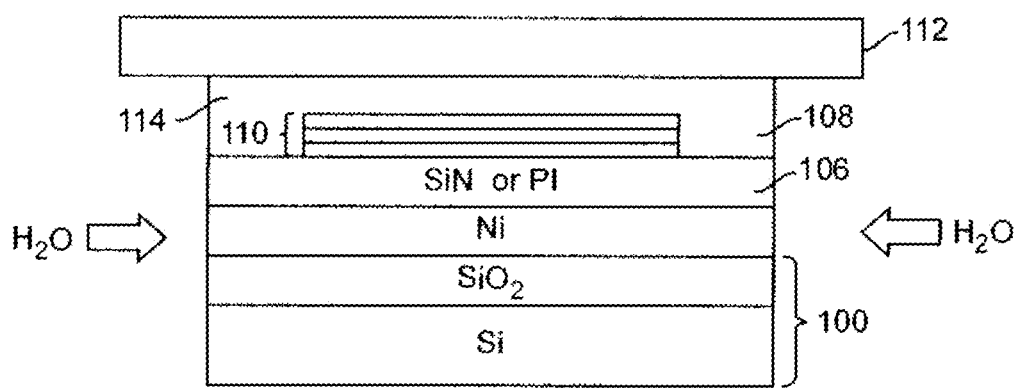

Next, referring to FIG. 1(c), a support layer 108 is formed over the metal layer 106. In the illustrated embodiment, the support layer 108 serves insulating and supporting functions for device layers subsequently formed over the support layer 108, and is formed of a polymer, such as polyimide, a nitride, such as silicon nitride, or another suitable material. The support layer 108 can be formed by any suitable deposition technique, and a thickness of the support layer 108 can be in a range of about 1 nm to about 10 µm, such as from about 10 nm to about 1 µm, from about 100 nm to about 900 nm, from about 100 nm to about 700 nm, from about 100 nm to about 500 nm, or from about 200 nm to about 400 nm. It is contemplated that the support layer 108 can be omitted for other embodiments.

Still referring to FIG. 1(c), a stack of device layers 110 is next formed over the support layer 108. In the illustrated embodiment, the stack of device layers 110, once formed as shown in FIG. 1(c), corresponds to a fully fabricated device, such as a fully fabricated or functioning electronic, optoelectronic, or magnetic device. For example, the stack of device layers 110 can be a thin-film device, such as a thin-film solar cell, or a nanowire-based device, such as a nanowire-based resistor, diode, or field effect transistor. Because the growth substrate 100 can be a conventional substrate, the stack of device layers 110 can be formed using conventional facilities and processes, such as photolithography, electron beam lithography, and other processes involving relatively high temperatures and exposure to relatively harsh chemicals.

Once the stack of device layers 110 is formed, a temporary holder 112 is affixed to the stack of device layers 110 as shown in FIG. 1(c). The temporary holder 112 can be a thermal release tape, for example. In the illustrated embodiment, a protection layer 114 is formed so as to encapsulate the stack of device layers 110, and the temporary holder 112 is affixed to a top surface of the protection layer 114. The protection layer 114 serves to protect the stack of device layers 110 from possible contamination from the temporary holder 112 and from undesired exposure to water or another debonding agent. As shown in FIG. 1(c), the protection layer 114 is formed of a polymer, such as poly(methylmethacrylate), or another suitable encapsulant, and can be formed by spin-casting or another suitable deposition technique. It is contemplated that the protection layer 114 can be omitted for other embodiments, and the temporary holder 112 can be directly affixed to the stack of device layers 110.

Next, referring to FIG. 1(d), environmentally-assisted interfacial debonding and, in particular, water-assisted interfacial debonding of the metal layer 106 is performed to separate the stack of device layers 110 and the metal layer 106 from the growth substrate 100. In the illustrated embodiment, water-assisted debonding is carried out by partial or full immersion in water or by otherwise contacting or exposing to water in a liquid or a vapor form. Penetration of water is induced along an interface between the metal layer 106 and the oxide layer 104, such as by peeling or otherwise manipulating the temporary holder 112 or by sonication or another suitable agitation mechanism, followed by separation of the metal layer 106 from the oxide layer 104 along the interface. Advantageously, water-assisted debonding can be carried out at a relatively mild temperature, such as in a range of about 1° C. to about 100° C., about 5° C. to about 50° C., about 10° C. to about 30° C., or about 15° C. to about 25° C., and without requiring an etchant or other harsh chemicals, thereby reducing the cost and complexity of the transfer technique. Also, penetration of water can readily occur through sidewalls, thereby allowing the transfer of devices with large area sizes, without requiring the formation of apertures or openings to facilitate penetration of water, and while imposing little or no stress and damage on the devices. It is contemplated that a set of cleaning operations can be performed on sidewalls of the metal layer 106 and the oxide layer 104 to remove any contaminants and further enhance penetration of water. Consequently as shown in FIG. 1(d), the stack of device layers 110 is separated from the growth substrate 100 and sandwiched between the temporary holder 112 and the metal layer 106. In the illustrated embodiment, the metal layer 106 is at least partially removed, such as by etching using a metal salt solution, although it is contemplated that the metal layer 106 can be retained to serve an electrical function, a heat conduction function, or an optical function, such as a bottom electrode or a back surface reflector.

Referring next to the option on the left as shown in FIG. 1(e), the temporary holder 112 and the stack of device layers 110 are affixed to a target substrate 116, and the combined structure is heated, such as a temperature in a range of about 50° C. to about 150° C., about 60° C. to about 140° C., about 70° C. to about 130° C., about 80° C. to about 120° C., or about 80° C. to about 100° C., to release the temporary holder 112. The protection layer 114 (if present) is removed by dissolving a polymer or other material forming the protection layer 114, such as using acetone or another organic solvent. The resulting structure includes the stack of device layers 110 affixed to the target substrate 116, and, although not shown in FIG. 1(e), the support layer 108 (as shown in FIG. 1(c)) can be included between the stack of device layers 110 and the target substrate 116. Because the stack of device layers 110 corresponds to a fully fabricated device, no further device fabrication operations are required, thereby avoiding exposure of the target substrate 116 to high temperatures and harsh chemicals. As such, the target substrate 116 can be a non-conventional substrate selected for desired properties during end use, such as flexibility, stretchability, transparency, biocompatibility, conductivity, low cost, lightweight, or a combination of such properties. In the case of non-adhesive target substrates, an adhesive, such as poly(dimethylsiloxane), polyvinyl alcohol, or a double sided tape, can be applied on the target substrates to improve adhesion and mitigate against wrinkling and curling of transferred devices.

Referring next to the option on the right as shown in FIG. 1(f), the support layer 108 serves as a target substrate, such that an additional target substrate can be omitted. Specifically, the temporary holder 112 is released by heating, such as a temperature in a range of about 50° C. to about 150° C., about 60° C. to about 140° C., about 70° C. to about 130° C., about 80° C. to about 120° C., or about 80° C. to about 100° C., and the protection layer 114 (if present) is removed by dissolving a polymer or other material forming the protection layer 114, such as using acetone or another organic solvent. The resulting structure includes the stack of device layers 110 affixed to the support layer 108, which serves as the target substrate. The support layer 108 can be a non-conventional substrate, such as a thin polyimide layer or another thin layer of a polymer or other suitable material. The resulting structure can be affixed to convoluted bio-materials as a conformal sensor, and the reduced thickness of the support layer 108 can provide improved sensitivity for bio-sensing purposes.

Figure 2:
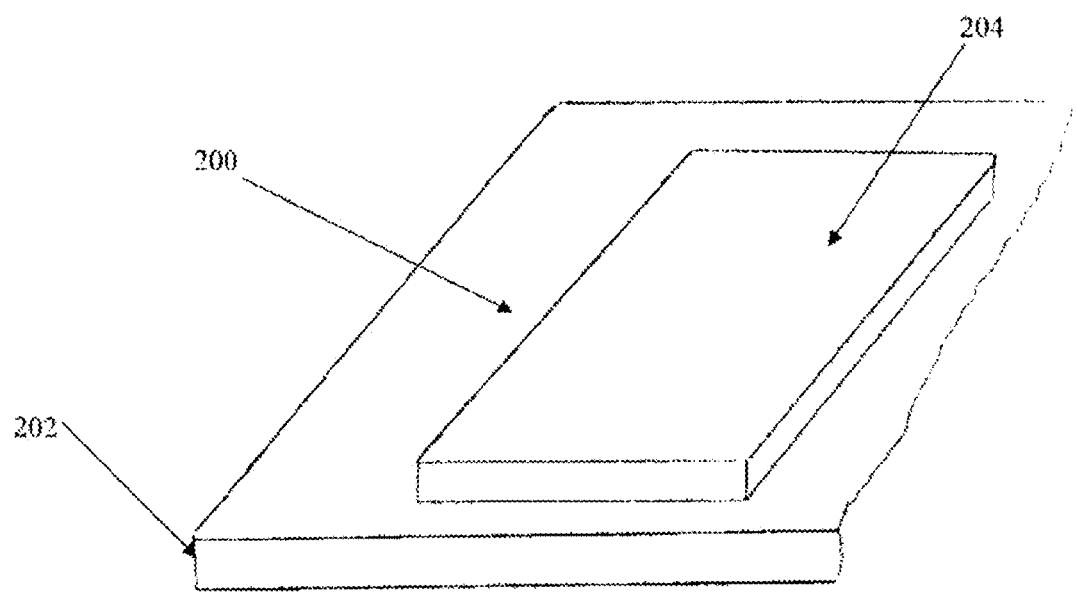
FIG. 2: Illustration of a resulting device on a non-conventional substrate.

FIG. 2 is an illustration of a resulting device 200 affixed to a non-conventional substrate 202. In the illustrated embodiment, the device 200 has a large device area 204 of at least about 0.05 cm$^2$, such as at least about 0.1 cm$^2$, at least about 0.5 cm$^2$, at least about 1 cm$^2$, at least about 5 cm$^2$, at least about 10 cm$^2$, or at least about 50 cm$^2$, and up to about 100 cm$^2$ or more. Because environmentally-assisted interfacial debonding, such as water-assisted interfacial debonding, can be performed without requiring the formation of apertures or openings, the device area 204 is substantially continuous and uninterrupted by such apertures or openings. Although one device 200 is shown in FIG. 2, it is contemplated that multiple devices can be affixed to the substrate 202, such as an array of devices.

Embodiments of the device transfer technique described herein provide a number of advantages, including one or more of the following:

1. Cost-effective, such as by allowing reuse of growth substrates subsequent to interfacial debonding.
2. Mild process temperatures, such as associated with interfacial debonding and release of temporary holders, thereby broadening the applicability of the technique.
3. Devices transferable onto diverse target substrates.
4. Scalability, such as by allowing wafer-scale transfer of arrays of devices.
5. Little or no mechanical and thermal stresses imposed by interfacial debonding in water or another debonding agent.
6. Highly efficient transfer that is substantially independent of materials and feature geometries, with substantially 100% transfer yield and with high resolution, such as on a nanometer scale.
7. Applicable to nanometer scale materials or devices, such as nanowire-based devices.
8. Transferred devices substantially retain their original geometries and electronic properties with high fidelity.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Fabrication of Nanowire-Based Electronic Devices on Non-Conventional Substrates by Water-Assisted Transfer Printing Method This example presents a versatile and wafer-scale water-assisted transfer printing (WTP) method that allows integration of nanowire-based devices onto diverse non-conventional substrates that are not readily accessible by other methods, such as paper, plastics, tapes, glass, poly(dimethylsiloxane) (PDMS), aluminum (Al) foil, and ultrathin polymer substrates. The transfer yield is substantially 100%, and the transferred devices substantially maintain their original geometries and electronic properties with high fidelity.

Figure 3:
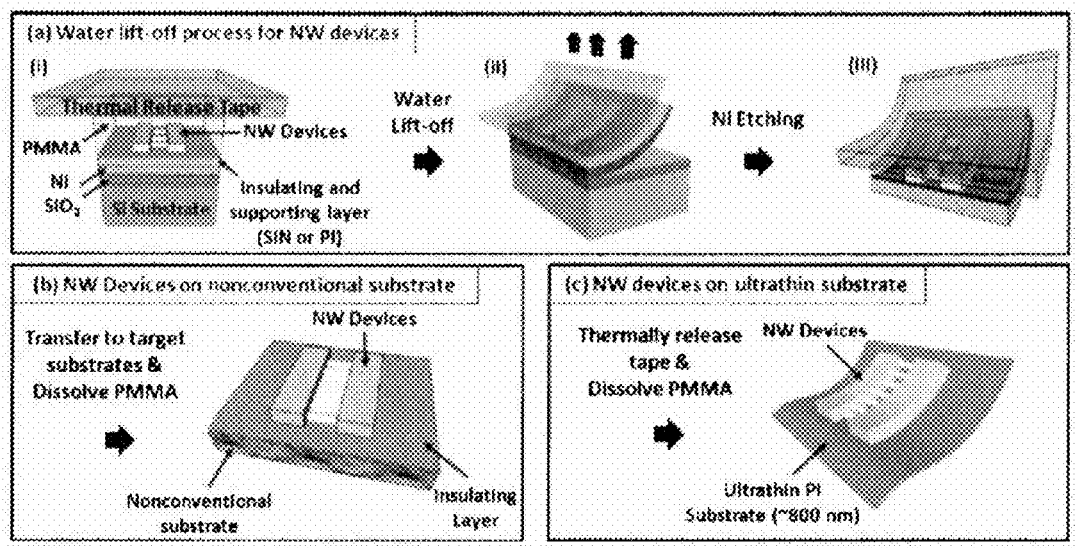
FIG. 3: Illustration of a water-assisted method for transferring nanowire-based devices to non-conventional substrates: (a) (i) pre-fabricated nanowire-based devices on a donor substrate→(ii) peel-off in water→(iii) etch a nickel layer (optional); (b) the transferred nanowire-based devices on a target substrate with an insulating layer in between; and (c) the transferred nanowire-based devices on an ultrathin polyimide substrate (about 800 nm).

In this example, the WTP method is based on the phenomenon of water penetrating into the interface between nickel (Ni) and silicon dioxide ($SiO_2$), which leads to lift-off of a Ni layer from a $SiO_2$/Si donor substrate. The WTP method is schematically illustrated in FIG. 3. First, a thin Ni layer (about 300 nm thick) is deposited on a $SiO_2$/Si wafer, and a thin layer of polyimide (PI, about 800 nm) or silicon nitride (SiN, about 300 nm) is deposited on top to function as an insulating and supporting layer for nanowire-based devices. Subsequently, arrays of the nanowire-based devices are fabricated on top of the insulating layer by conventional photolithography. A thermal release tape (TRT) as a temporary holder is then attached to the top of the substrate with a layer of spin-casted poly(methylmethacrylate) (PMMA) in between to protect the nanowire-based devices from polymer contamination by the TRT (FIG. 3a, (i)). Next, the whole structure is soaked in de-ionized water at about room temperature, followed by the peel-off of an edge of the TRT to initiate the penetration of water. Within about 3-4 s, the structure separates at the interface between Ni and $SiO_2$, and thereby the nanowire-based devices are separated from the Si wafer and sandwiched between the Ni layer and the TRT (FIG. 3a, (ii)). The Ni layer is then etched away by a Ni etchant (FIG. 3a, (iii)). Finally, the TRT carrying the structure (PMMA/nanowire-based devices/insulating and supporting layer) is pasted onto any target substrate. In the case of non-adhesive target substrates, such substrates are pre-coated with a thin adhesive layer, such as PDMS or poly(vinyl alcohol) (PVA), for the purpose of adhesion, planarization, and strain isolation. Afterward, the TRT is released from the structure by heating at about 90° C. for about 5-6 s, followed by dissolution of the PMMA with acetone, leaving the nanowire-based devices on the target substrate (FIG. 3b). Alternatively, nanowire-based devices on ultrathin PI substrate are achieved by releasing the TRT and dissolving the PMMA without any target substrate (FIG. 3c).

Figure 4:
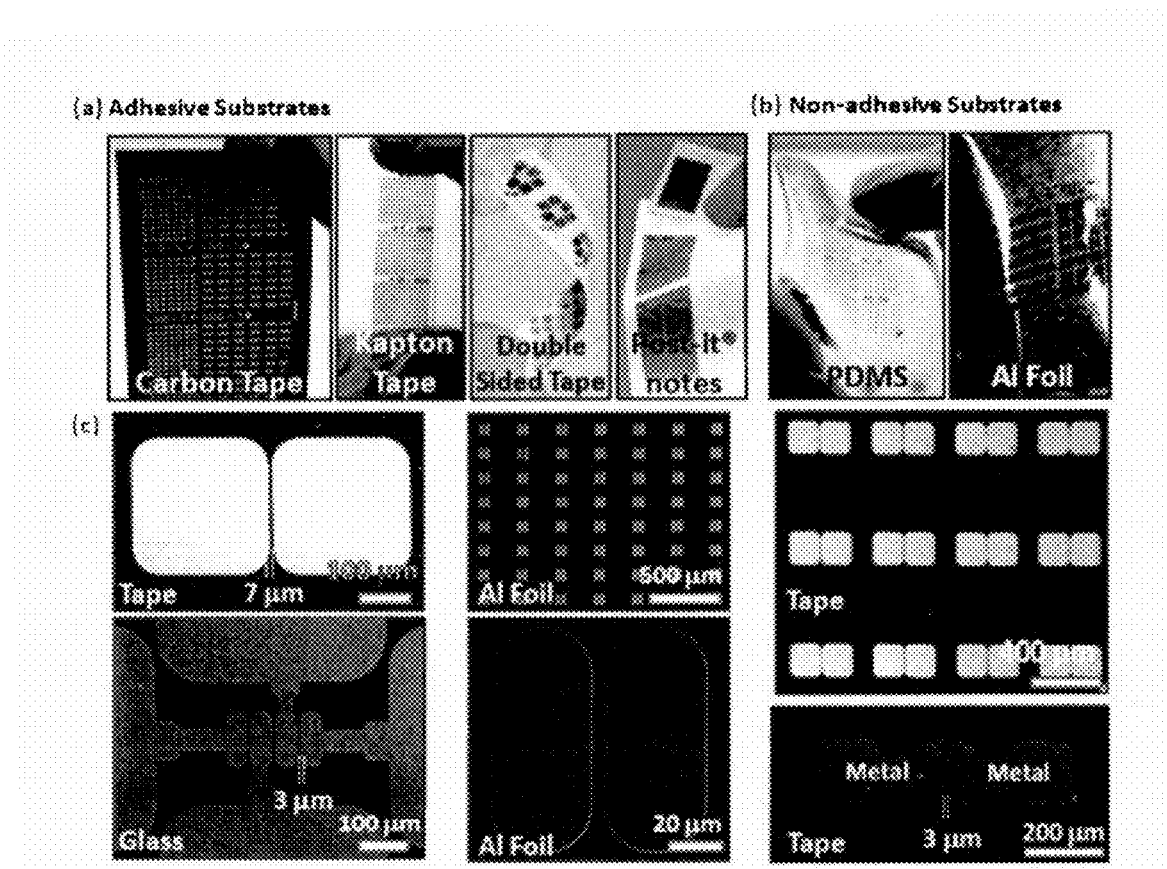
FIG. 4: Images of transferred microelectrode arrays to a range of (a) adhesive substrates such as carbon tape, Kapton tape, double-sided tape, and Post-it notes, and (b) non-adhesive substrates such as poly(dimethylsiloxane) and aluminum foil. (c) Representative scanning electron microscopy images of the transferred microelectrode arrays onto the diverse non-conventional substrates.
Figure 5:
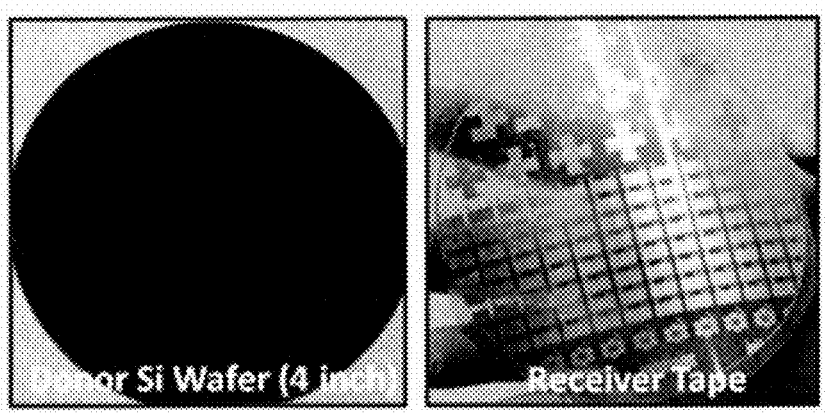
FIG. 5: Images of a reusable donor silicon wafer (left) and wafer-scale transferred microelectrode arrays on an adhesive tape (right).

The WTP method offers several advantages compared to other methods. First, since the WTP process requires no harsh chemicals and applies negligible mechanical and thermal stresses on target substrates, virtually any target substrate can be used, such as those that can withstand the heating temperature (about 90° C.) for releasing the TRT and the acetone for dissolving the PMMA. Second, the WTP method is highly scalable and reliable. 4 inch wafer-scale areas of microelectrodes have been successfully transferred to diverse non-conventional substrates with high fidelity to their original shapes (e.g., straight and round edges), thicknesses (about 80 to about 250 nm), feature sizes (dimension from about 30 μm to cm scale), and electrode gap distances (down to about 3 μm, which is bounded by the resolution of photolithographic equipment, not by the WTP method) (FIG. 4). Of note, the transfer yield is substantially 100% regardless of feature geometries and materials. Also, when the WTP method is used to transfer nanowire-based devices, the electric properties of the devices are also substantially preserved after the transfer. The WTP method also is very fast in that a 4 inch wafer of nanowire-based devices is separated from the donor substrate within about 3-4 s in water at about room temperature. In addition, the original donor $SiO_2$/Si wafer is clean and reusable after the transfer, which provides a major cost-saving factor (FIG. 5).

Figure 6:
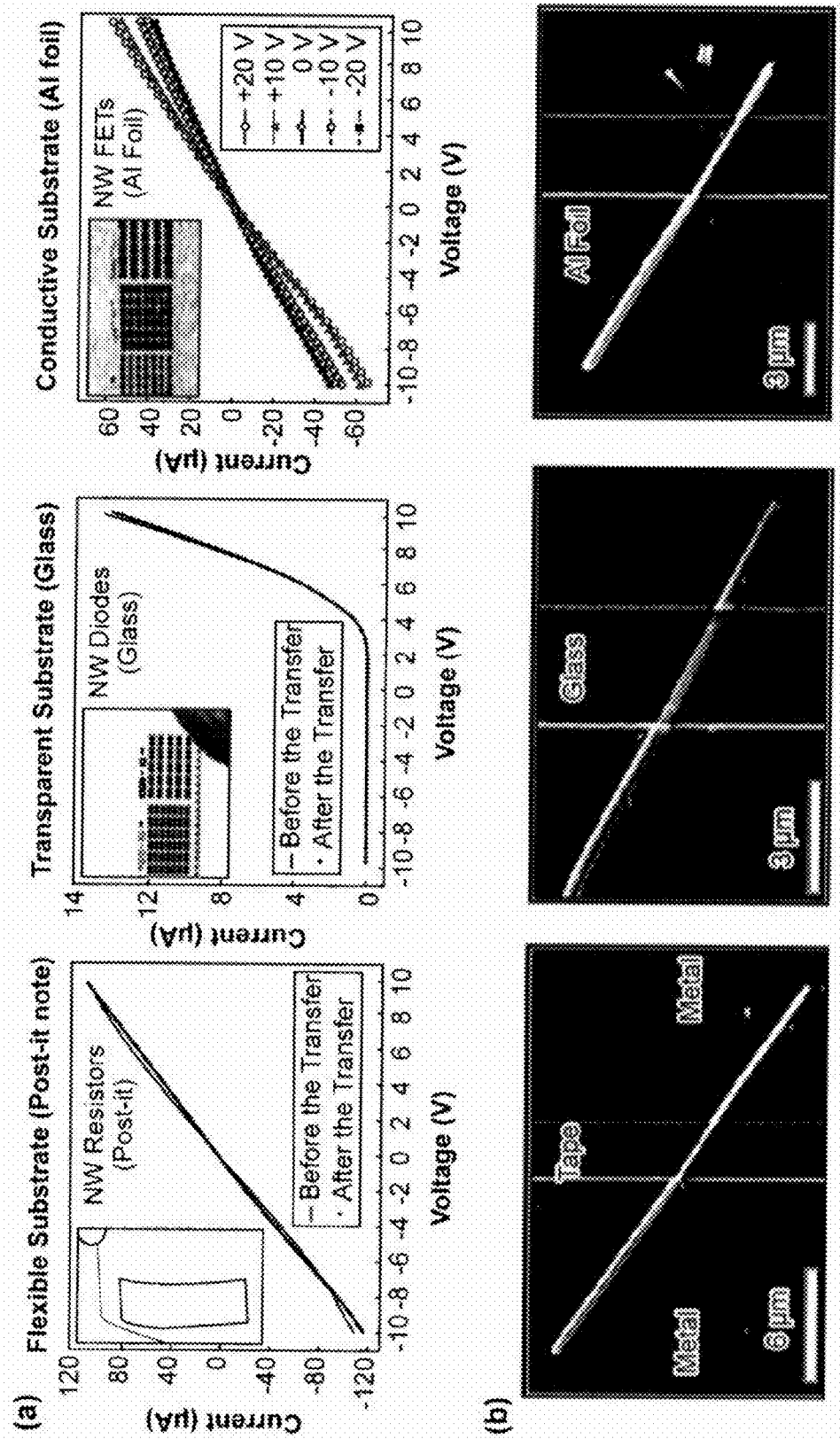
FIG. 6: (a) Representative I-V curves of nanowire-based resistors (left) and nanowire-based diodes (middle) before (lines) and after (dots) the transfer to Post-it note and glass. Transferred nanowire-based field effect transistors onto aluminum foil (right) are modulated by applied gate voltages ranging from about −20 V to about +20 V. Insets provide images of the transferred nanowire-based devices. (b) Scanning electron microscopy images of the transferred nanowire-based devices on tape, glass, and aluminum foil.
Figure 7:
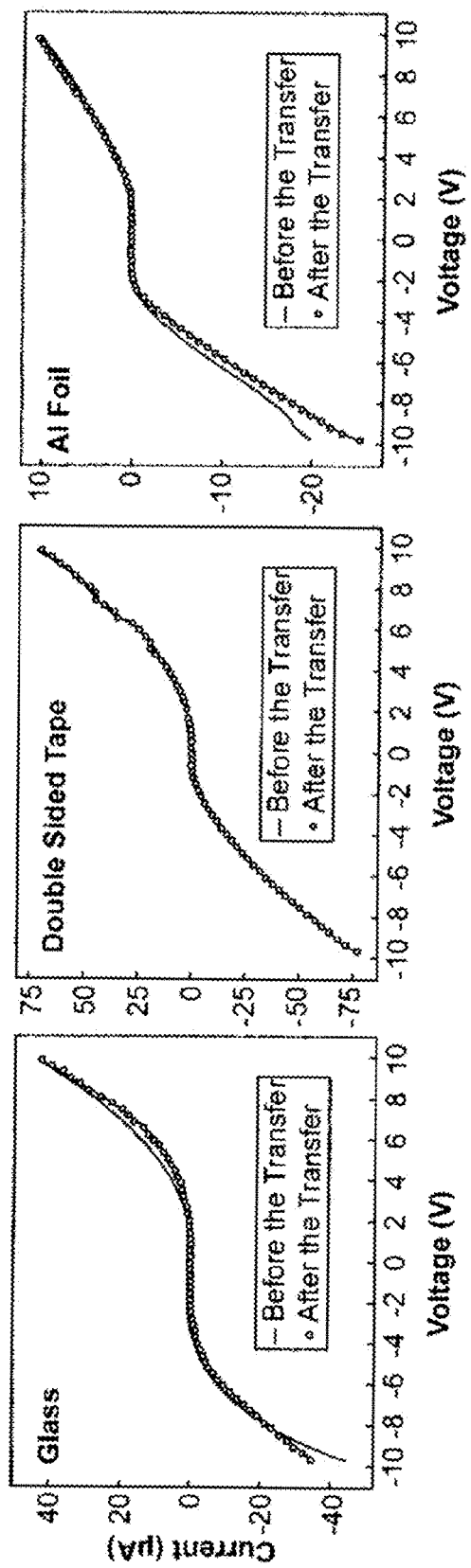
FIG. 7: Nonlinear I-V curves are substantially preserved before (lines) and after (dots) the transfer to (a) glass (b) double-sided tape and (c) aluminum foil.
Figure 8:
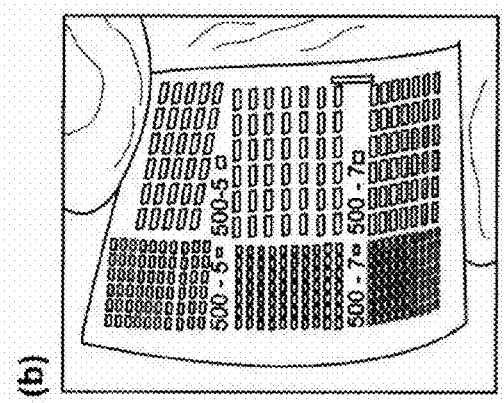
FIG. 8: (a) I-V curves of nanowire-based field effect transistors after the transfer to a conductive tape. The nanowire-based field effect transistors are modulated by applied gate voltages ranging from about −20V to about +20V. (b) Image of the transferred nanowire-based field effect transistors on the conductive tape.
Figure 8:
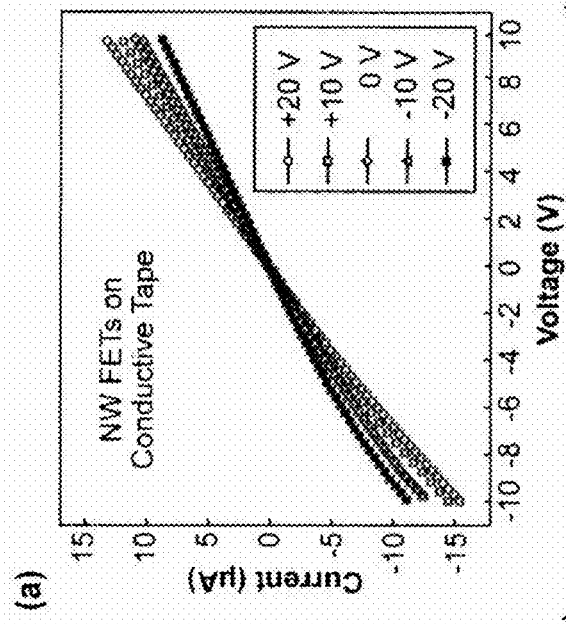

To illustrate these advantages of the WTP method, the method was used to transfer a range of nanowire-based electronic devices, such as resistors, diodes, and field effect transistors (FETs), onto diverse non-conventional substrates with desired properties, such as flexibility (e.g., tapes and Post-it notes), transparency (e.g., glass and PDMS), and conductivity (e.g., Al foil and conductive tapes that can be used as back gate electrodes of the nanowire-based FETs). FIG. 6a shows representative optical images and current-voltage (I-V) curves of nanowire-based electronic devices transferred to Post-it notes, glass, and Al foil. Closer scanning electron microscopy (SEM) inspection (FIG. 6b) shows that the WTP method produces no visible damage to the silicon nanowires and the metal electrodes. Furthermore, the I-V curves (FIG. 6a), including nonlinear ones (FIG. 7), remain substantially the same after the transfer, indicating that the WTP method generates negligible mechanical and thermal stresses to the nanowires and the metal electrodes. Moreover, the transferred nanowire-based electronics show linear, rectifying, and gate-modulated behaviors as expected for the nanowire-based resistors, diodes, and FETs, respectively (FIG. 6a). The transconductance of the transferred silicon nanowires are about 148 nS on Al foil and about 74 nS on conductive carbon tape (FIG. 8), comparable to those observed in silicon nanowire-based FETs fabricated on a planar $SiO_2$/Si wafer by electron beam lithography with a transconductance ranging from about 45 to about 800 nS.

Figure 9:
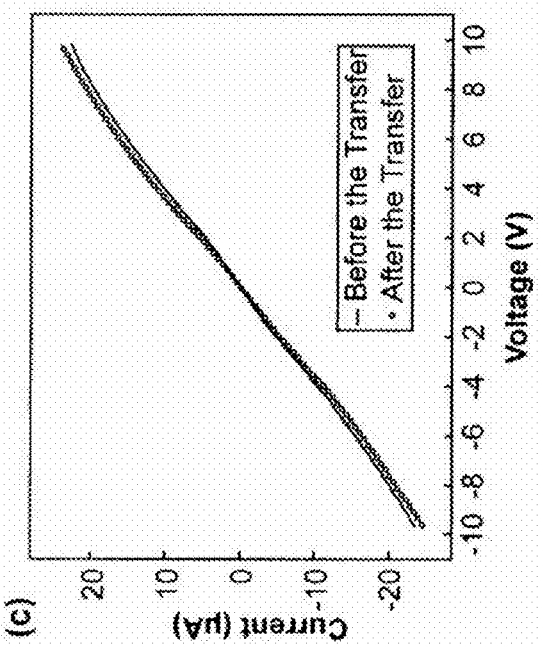
FIG. 9: (a) Images of transferred nanowire-based devices on top of an ultrathin polyimide sheet. The ultrathin polyimide sheet is wrapped around gloved finger tips (left) and a squeezed plastic bottle (right). (b) Scanning electron microscopy images of the transferred nanowire-based devices on the ultrathin polyimide sheet. (c) Representative I-V curve of the nanowire-based devices before (lines) and after (dots) the transfer to the ultrathin polyimide sheet.
Figure 9:
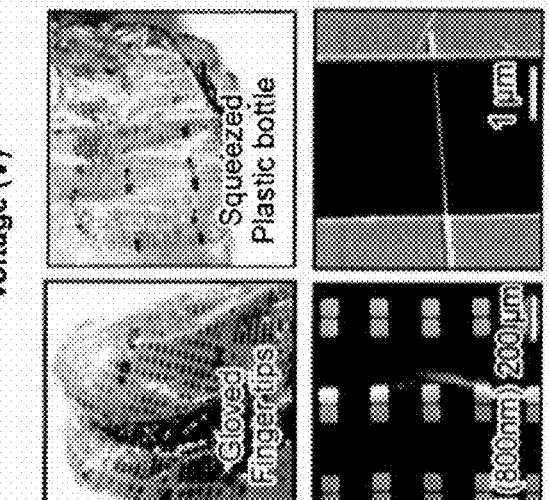

Next, the WTP method was applied to fabricate nanowire-based devices on an ultrathin sheet of PI, which was achieved by releasing the TRT and dissolving the PMMA without any target substrate (FIG. 3c). The lifted ultrathin PI sheet (about 800 nm) with the nanowire-based devices on top can be mounted onto soft and curved surfaces, such as biological tissues, and the highly conformal interface between the nanowire-based devices and the tissues can improve signal-to-noise ratios for biosensing applications. To demonstrate the conformal coating capability, the ultrathin PI sheet with the nanowire-based devices on top was wrapped around two finger tips (FIG. 9a, left). Moreover, the PI sheet can be released from the finger tips by soaking in water and loaded repeatedly onto other surfaces such as a squeezed plastic bottle (FIG. 9a, right), demonstrating the mechanical robustness and conformability of the ultrathin sheet. Representative SEM images (FIG. 9b) show that metal electrodes are smoothly wrinkled following the deformation of the PI sheet, and nanowires bridged between the metal electrodes have no visible damage after the transfer. Moreover, the I-V curves of the nanowire-based devices are substantially identical before and after the transfer, confirming that the devices are substantially intact during the WTP method (FIG. 9c). Given the conformability, robustness, and biocompatibility of the PI sheet, it is expected that ultrathin nanowire-based FETs can be applied as conformal, ultrasensitive biosensors for biological tissues.

Figure 10:
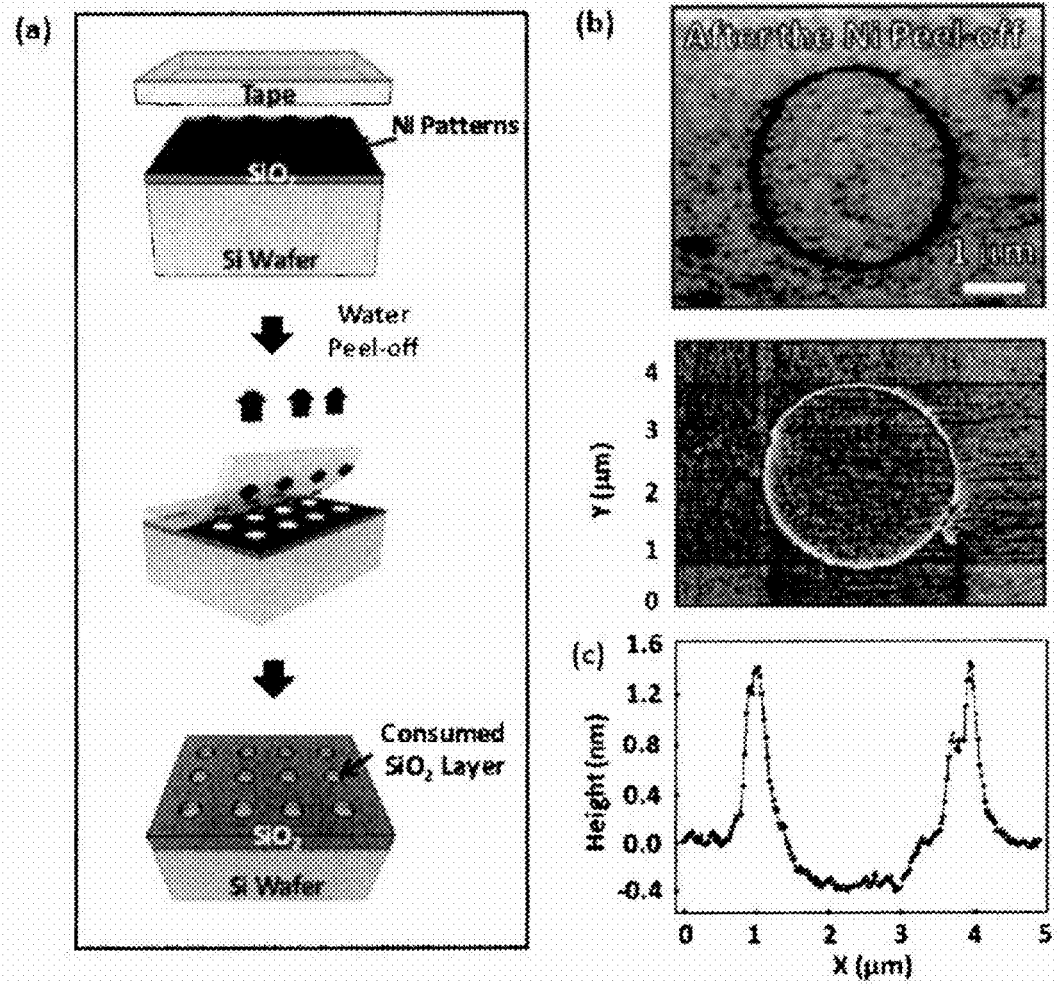
FIG. 10: Mechanism study of a water-assisted transfer printing method: (a) illustration of the method for detaching patterned nickel circles; (b) representative scanning electron microscopy (top) and atomic force microscopy (bottom) images of the nickel circles after the transfer; and (c) atomic force microscopy measurements showing that the average height is lower inside than outside of a nickel circle. The height peaks at edges of the nickel circle denote nickel residues after the transfer, and the peaks were used to locate the nickel circle during the measurements.
Figure 11:
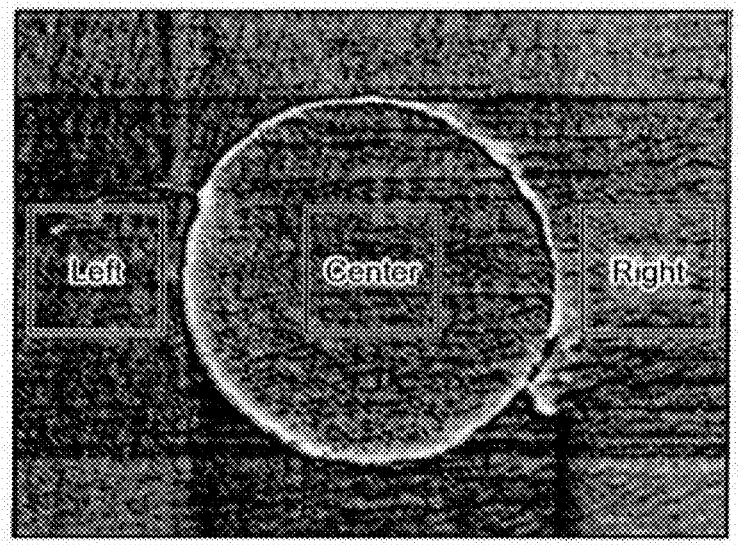
FIG. 11: Statistical data of atomic force microscopy measurements. (a) Representative atomic force microscopy image after a water-assisted transfer of a nickel circle. Three different areas were selected from inside (inside box) and outside (outside boxes) of the nickel circle for counting pixels of the height in the image. (b) A histogram of counted pixels corresponding to the height from the left (top), center (middle), and right (bottom) of the nickel circle. The distribution of the height inside the nickel circle is shifted to the left, showing that the height is lower inside than outside the nickel circle.
Figure 11:
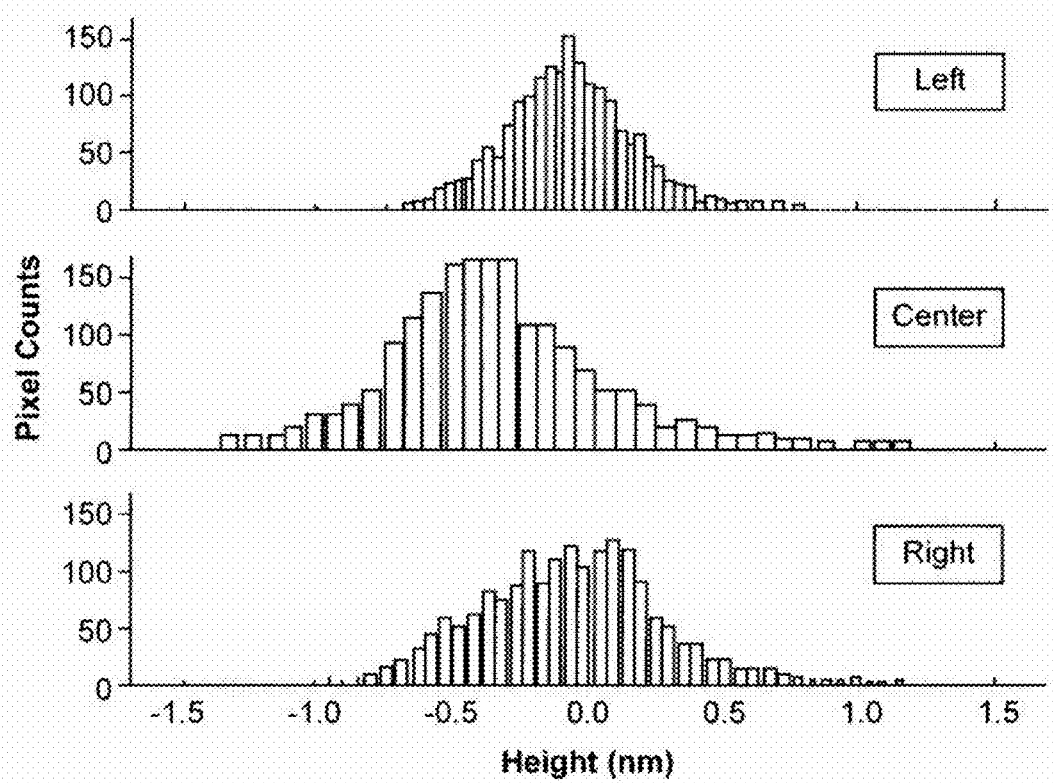

Moreover, the mechanism for the separation of the Ni layer from the $SiO_2$/Si wafer in the presence of water was investigated. Without wishing to be bound by a particular theory, it is expected that Ni reacts with $SiO_2$ during the Ni deposition process by electron beam evaporation, forming Ni silicate or Ni oxide. When the Ni silicate or Ni oxide contacts water, Ni hydroxide ($Ni(OH)_2$) is formed, and thus its surface becomes hydrophilic. On the other side of the split interface, the $SiO_2$ surface is terminated with either, or both, —H and —OH groups when in contact with water and becomes hydrophilic as well. Consequently, water can quickly penetrate into the interface between the two hydrophilic surfaces, leading to the separation of the Ni layer from the $SiO_2$/Si wafer. To further test this proposed mechanism, an array of circular Ni patterns (about 3 µm in diameter) was deposited on a $SiO_2$/Si wafer by electron beam evaporation, followed by water soaking (FIG. 10a). The SEM (top) and atomic force microscopy (AFM) (bottom) images in FIG. 10b show that water soaking detaches the Ni circles from the donor substrate with some Ni residues left at the edges. Moreover, FIG. 10c shows that the average height along the centerline on the donor substrate is lower inside than outside the circle (FIG. 11). Further AFM measurements of 24 randomly chosen circles indicate that the average height inside the original Ni circle on the donor substrate is approximately 2.45 Å lower than that of the outside. These results confirm that the top surface of the $SiO_2$ layer is at least partially consumed by reacting with Ni, supporting the above proposed mechanism.

In summary, this example demonstrates a WTP method to integrate nanowire-based electronic devices on diverse non-conventional substrates. The WTP method requires no harsh fabrication processes on target substrates, allowing the use of non-conventional substrates that are not readily accessible by other methods. The WTP method has the advantages of simplicity, low cost, substantially 100% transfer yield regardless of transferred materials and feature geometries, and high fidelity to original devices after the transfer. The WTP method can endow electronic devices with desirable properties through their non-conventional substrates, such as flexibility, conformability, transparency, adhesion, conductivity, and biocompatibility, and thereby impact a range of applications, such as biosensing, flexible displays, robotics, and energy conversion systems. The WTP method also can be used to transfer electronic devices based on other nanomaterials (e.g., carbon nanotubes and graphene), thin-film devices (e.g., thin-film transistors and thin-film solar cells), and vertical devices (e.g., vertical nanowire-based FETs) to non-conventional substrates.

Example 2

Fabrication of Thin-Film Solar Cell on Non-Conventional Substrates

Fabrication of thin-film solar cells (TFSCs) on substrates other than Si and glass has been challenging because non-conventional substrates typically are not suitable for TFSC fabrication processes due to poor surface flatness and low tolerance to high temperature and chemical processing. This example presents a peel-and-stick method that circumvents these fabrication challenges by peeling off fully fabricated TFSCs from an original Si wafer and attaching TFSCs to virtually any substrate regardless of materials, flatness, and rigidity, and without changing material deposition conditions and performance of TFSCs. With the peel-and-stick method, hydrogenated amorphous silicon (a-Si:H) TFSCs are integrated on paper, plastics, cell phone, and building windows while substantially maintaining an original efficiency of about 7.5%. The peel-and-stick method allows further reduction of the cost and weight for TFSCs and endows TFSCs with flexibility and attachability for broader application areas.

The peel-and-stick method includes two operations: 1) peeling-off fully fabricated TFSCs in water from a Ni-coated Si wafer used for fabrication, and 2) attaching the peeled-off TFSCs to the surface of any substrate. Without wishing to be bound by a particular theory, the peeling process can be based on the phenomenon of water-assisted subcritical debonding at the interface between Ni and $SiO_2$, which separates the metallic layer together with TFSCs from the original Si wafer. Since the peel-and-stick method does not require any fabrication on the final target substrate, the method circumvents the fabrication challenges associated with non-conventional substrates. Of note, the efficiency of the transferred TFSCs on any target substrate remains substantially the same as the as-fabricated TFSCs on Si wafers.

Figure 12:
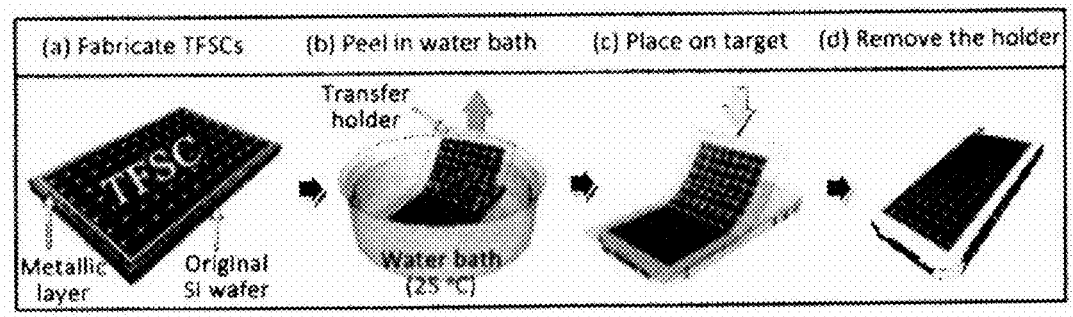
FIG. 12: Operations of a peel-and-stick method. (a) As-fabricated thin-film solar cells on an original silicon/silicon dioxide wafer. (b) The solar cells are peeled off from the wafer in a water bath at about room temperature. (c) The peeled off solar cells are attached to a target substrate with an adhesive agent. (d) The temporary transfer holder is removed, and the solar cells remain on the target substrate.

The operations of the peel-and-stick method are illustrated in FIG. 12. First, a Si/$SiO_2$ wafer is coated with a Ni film (about 300 nm) by electron beam evaporation, and subsequently TFSCs are deposited on top of the metallic layer using conventional TFSC fabrication procedures (FIG. 12a). Second, a TRT (NittoDenko®) is attached to the top of the TFSCs serving as a temporary transfer holder. A transparent protection layer (ProTek®) is spin-casted in between the TFSCs and the TRT to protect the TFSCs from tape polymer contamination and direct contact with water. Third, the entire structure is soaked in a water bath at about room temperature. Inside the water bath, an edge of the TRT is slightly peeled back to promote water penetration into the Ni/$SiO_2$ interface. The Ni/$SiO_2$ interface is separated due to water-assisted subcritical debonding, leading to the TFSCs peeling-off from the original Si/$SiO_2$ wafer (FIG. 12b). Next, the TRT holding the peeled-off TFSCs is heated at about 90° C. for a few seconds to weaken its adhesion to the TFSCs. The TFSCs are then attached to various surfaces using conventional adhesive agents, such as double-sided tapes or PDMS (FIG. 12c). After removing the TRT, the TFSCs remain on the target substrate, such as a cell phone, paper, a metal foil, a plastic, or a textile (FIG. 12d).

Figure 13:
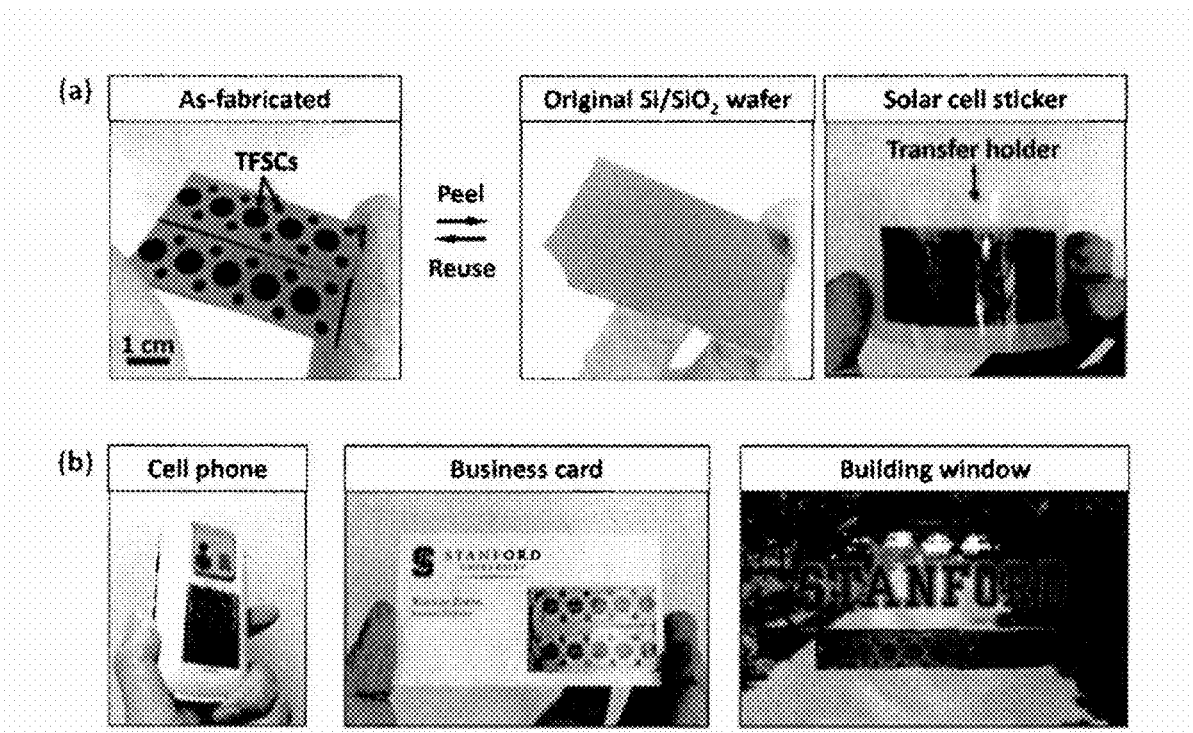
FIG. 13: Thin-film solar cells at different stages of a peel-and-stick method. (a) As-fabricated solar cells on an original nickel-coated silicon/silicon dioxide wafer (left). The donor silicon/silicon dioxide wafer is clean and reusable after the peeling-off operation (middle). The solar cells are held by a temporary transfer holder (right). (b) Solar cells on a cell phone (left), a business card (middle), and a building window (right)

To demonstrate the peel-and-stick method, a-Si:H TFSCs are used as a model system. In this example, the fabrication conditions for the a-Si:H TFSCs are substantially identical to those typically used for fabricating TFSCs on Si wafers (See the Methods section for TFSC fabrication details). FIG. 13a (left image) shows a representative optical image of the as-fabricated a-Si:H TFSCs on the Ni-coated Si/SiO$_2$ wafer before the peel-and-stick method, as also illustrated in FIG. 12a. The large and small round circles correspond to solar cells with an area of about 0.28 cm$^2$ or about 0.05 cm$^2$, respectively. After peeling-off the TFSCs in a water bath (FIG. 12b), the Si wafer is clean and reusable (FIG. 13a, middle image), and the TFSCs are held temporarily by the TRT (FIG. 13a, right image). Notably, the TFSCs after the peel-and-stick method show no visible damages. Next, the peeled-off TFSCs are attached to virtually any substrate, including a cell phone, a business card, and a building window (FIG. 13b). The peel-and-stick method allows for integrating TFSCs into buildings, clothes, and other non-conventional substrates that are not readily accessible due to incompatibility with conventional TFSC fabrication procedures.

Figure 14:
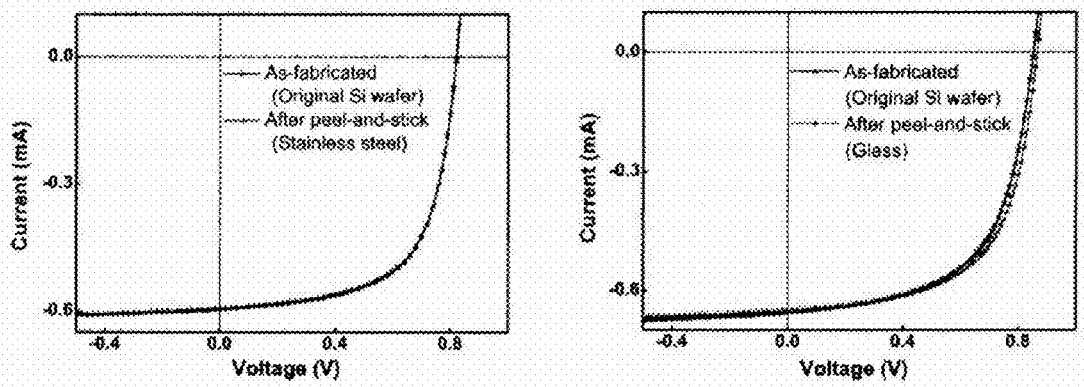
FIG. 14: Comparisons of thin-film solar cell performances before and after a peel-and-stick method. Representative I-V characteristics of the as-fabricated solar cells (lines with stars) are substantially the same as those after transferring the solar cells (lines with dots) to stainless steel (left) and soda-lime glass (right).
Figures 15, 16:
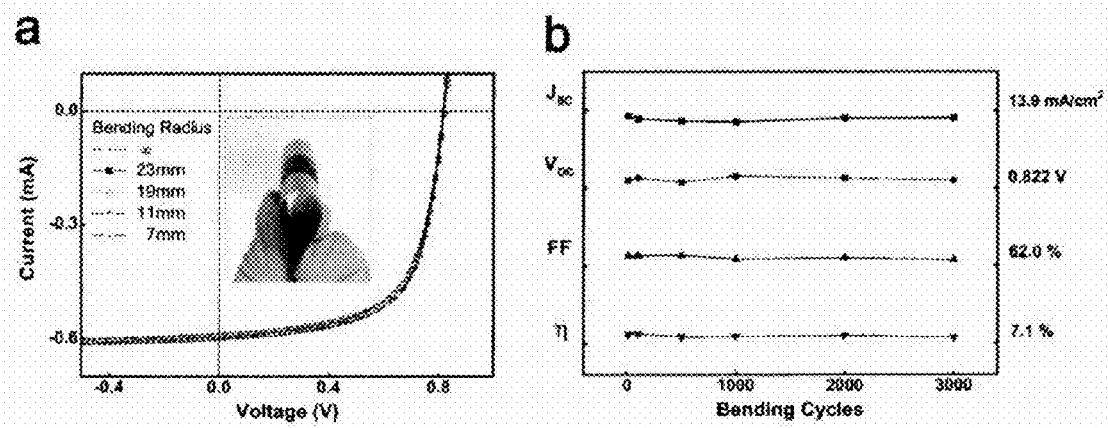
FIG. 15: Table presenting statistic summary of average performance metrics over 20 hydrogenated amorphous silicon solar cells before and after a peel-and-stick method.
FIG. 16: Mechanical flexibility of transferred thin-film solar cells. (a) I-V characteristics of the solar cells remain substantially the same after bending a flexible sheet with a range of bending radius from ∞ down to about 7 mm. (b) The flexible solar cells show no detectable performance change over 3,000 cycles of bending with bending radius of about 10 mm. The I-V characteristics are measured when the solar cells are flat to mitigate against any damage from sharp tungsten probe tips during measurements.

Of note, the a-Si:H TFSCs show substantially identical efficiency before and after the peel-and-stick method. FIG. 14 shows I-V characteristics of representative TFSCs before and after the peel-and-stick method applied to a sheet of stainless steel (left) or a soda-lime glass slide (right), and the I-V characteristics are virtually indistinguishable, indicating that no detectable damages are induced in the TFSCs during the peel-and-stick method. FIG. 15 includes a table that summarizes average performance metrics over 20 solar cells with areas of about 0.05 cm$^2$ and about 0.28 cm$^2$, showing η=7.4±0.5% and 5.2±0.1%, respectively, before the peel-and-stick method, and η=7.6±0.5% and 5.3±0.1%, respectively, after the peel-and-stick method. The efficiency difference for the different sizes of solar cells is expected to result from larger series resistance in larger solar cells. Both sizes of solar cells have substantially identical efficiencies before and after the peel-and-stick method, with an observed 5% variation that is within measurement errors. These results demonstrate several advantages of the peel-and-stick method: versatility in substrate choices, high fidelity to original TFSC performance, simplicity and scalability of the operations, and additional cost-saving features with reusable 7Si/SiO$_2$ wafers.

Applications of TFSCs involve bending or non-planar shaping. The peel-and-stick method allows TFSCs to be integrated with flexible or curved surfaces (e.g., wavy building roof, helmets, and portable electronics). To demonstrate this aspect, a-Si:H TFSCs are transferred to a flexible sheet of stainless foil (about 0.2 mm thick) and manually bended as shown in FIG. 16a (inset). I-V characteristics of the TFSCs remain substantially the same after bending the flexible sheet with a range of bending radius from ∞ down to about 7 mm (FIG. 16a). In addition, the solar cell performances are substantially unchanged over 3,000 cycles of bending with bending radius of about 10 mm (FIG. 16b), demonstrating the mechanical flexibility and robustness of the transferred TFSCs. It should be noted that the mechanical properties of the final solar cells are not governed by the peel-and-stick method, but rather by the intrinsic material properties and dimensions of the TFSCs (e.g., a-Si:H as an active material and indium tin oxide (ITO) as an electrode).

In summary, this example demonstrates a versatile peel-and-stick method to integrate TFSCs on diverse substrates, such as paper, plastic, cell phones, and buildings. The peel-and-stick method, while preserving TFSC performance, circumvents the fabrication challenges associated with non-conventional substrates by separating the fabrication process from a final target substrate. The non-conventional substrates for TFSCs allow further reduction of the cost and weight, and endow TFSCs with flexibility and attachability to greatly broaden their application areas. It is expected that the peel-and-stick method can be applied to other types of TFSCs and thin-film electronics.

Methods:

Fabrication of the a-Si:H TFSCs:

A Si wafer (about 500 mm thick) with thermally grown SiO$_2$ (about 300 nm thick) was cleaned by conventional wafer cleaning procedures. The metallic layer (Ni, about 300 nm thick) and subsequent silver bottom electrodes (about 1 μm thick) were deposited on the Si/SiO$_2$ wafer at about room temperature by using electron beam evaporation with a deposition rate of about 1-3 A°/s. The a-Si:H TFSCs with n-i-p structure were deposited by plasma enhanced chemical vapor deposition (PECVD) in a multi-chamber cluster tool (MV-Systems, Inc.) at a substrate temperature of about 200° C. with about 13.56 MHz RF power. The n-layer (about 20 nm) was grown using SiH$_4$ and PH$_3$/H$_2$ with E$_{Tauc}$ of about 1.75 eV and σ$_{dark}$ of about 2×10$^{-2}$ S/cm. The i-layer (about 300 nm) was grown using SiH$_4$ without hydrogen dilution with E$_{Tauc}$ of about 1.78 eV and σ$_{dark}$ of about 2×10$^{-10}$ S/cm. The p-layer (about 8 nm) was grown using SiH$_4$, BF$_3$, and H$_2$ with E$_{Tauc}$ of about 2.1 eV and σ$_{dark}$ of about 5×10$^{-4}$ S/cm. Finally, ITO (about 90% In$_2$O$_3$, about 10% SnO$_2$) dots were RF sputtered at about 200° C. using an Ar/O$_2$ mixture to form individual solar cells with the RF power of about 0.25 W/cm$^2$ and deposition rate of about 1 A°/s.

Peel-and-Stick Method:

The as-fabricated a-Si:H TFSCs were cleaned by solvents and dried on a hot plate at about 120° C. for about 3 minutes. A transparent protection layer (ProTek®) was spin-casted at about 3,000 rpm and annealed at about 110° C. and about 175° C. for about 3 minutes sequentially. The protection layer residues at the Si wafer sidewalls were removed by a razor blade. After applying a TRT on top of the protection layer, the whole structure was immersed into a water bath at about room temperature. An edge of the TRT was slightly peeled-off to initiate the water penetration, causing the separation of the Ni layer together with the TFSCs from the Si/SiO$_2$ wafer. The lifted TFSCs were dried by N$_2$ gun and heated at about 90° C. for about 30 s to weaken the adhesion of the TRT. In the mean time, the target substrate was pasted or coated with commercial adhesive agents such as double-sided tape or PDMS. Finally, the TFSCs were attached on the target substrate, and the TRT was removed. The protection layer was then removed for the I-V curve measurements.

Characterization of the TFSCs:

The solar cell properties were characterized under AM 1.5G illumination (Class AAA solar simulator, Model 94063A, Oriel). Before each measurement, the solar simulator intensity was calibrated with a reference Si solar cell and a readout meter for solar simulator irradiance (Model 91150V, Newport). I-V characteristics were measured by contacting the top and bottom electrodes of the solar cells with tungsten probes that are connected to a semiconductor analyzer (Model 4200-SCS, Keithley). To mitigate against damage of the TFSCs from sharp tungsten tips during the measurements, the solar cells were measured when they were flat. For additional protection from the sharp tungsten tips, a small Ag dot with a diameter of about 1 mm was added to the top surface of ITO using Ag paste (Ted Pella, Inc.), and its area was excluded when calculating the solar cell efficiency.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, operation or operations, to the objective, spirit and scope of the invention. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A device fabrication method, comprising:
   providing a growth substrate including an oxide layer;
   forming a metal layer over the oxide layer;
   forming a stack of device layers over the metal layer;
   performing fluid-assisted interfacial debonding of the metal layer to separate the stack of device layers and the metal layer from the growth substrate; and
   affixing the stack of device layers to a target substrate.

2. The device fabrication method of claim 1, wherein the oxide layer is a silicon oxide layer.

3. The device fabrication method of claim 1, wherein the metal layer includes a ductile metal having a percentage elongation at break of at least 8%.

4. The device fabrication method of claim 1, wherein the metal layer includes at least one metal selected from nickel, copper, and aluminum.

5. The device fabrication method of claim 1, further comprising:
   removing at least a portion of the metal layer prior to affixing the stack of device layers to the target substrate.

6. The device fabrication method of claim 1, wherein performing fluid-assisted interfacial debonding is carried out using a fluid in at least one of a liquid form and a vapor form.

7. The device fabrication method of claim 1, wherein performing fluid-assisted interfacial debonding is carried out at a temperature in a range of 10° C. to 30° C.

8. The device fabrication method of claim 1, wherein performing fluid-assisted interfacial debonding includes performing water-assisted interfacial debonding.

9. The device fabrication method of claim 1, wherein performing fluid-assisted interfacial debonding includes:
   inducing penetration of a fluid along an interface of the metal layer and the oxide layer; and
   separating the metal layer from the oxide layer along the interface.

10. The device fabrication method of claim 1, further comprising:
    forming a protection layer encapsulating the stack of device layers prior to performing fluid-assisted interfacial debonding.

11. The device fabrication method of claim 10, further comprising:
    removing the protection layer subsequent to performing fluid-assisted interfacial debonding.

12. The device fabrication method of claim 1, wherein performing fluid-assisted interfacial debonding is carried out without an etchant.

13. A device fabrication method, comprising:
    providing a growth substrate including an oxide layer;
    forming a metal layer over the oxide layer;
    forming a support layer over the metal layer;
    forming a stack of device layers over the support layer; and
    performing fluid-assisted interfacial debonding of the metal layer to separate the stack of device layers, the support layer, and the metal layer from the growth substrate.

14. The device fabrication method of claim 13, further comprising:
    removing the metal layer with the support layer serving as a target substrate for the stack of device layers.

15. The device fabrication method of claim 14, wherein the support layer is a polymer layer.

16. The device fabrication method of claim 14, wherein the support layer has a thickness up to 10 μm.

17. The device fabrication method of claim 13, wherein the oxide layer is a silicon oxide layer, and the metal layer includes at least one metal selected from nickel, copper, and aluminum.

18. The device fabrication method of claim 13, wherein performing fluid-assisted interfacial debonding includes performing water-assisted interfacial debonding.

19. The device fabrication method of claim 13, further comprising:
    forming a protection layer encapsulating the stack of device layers prior to performing fluid-assisted interfacial debonding.

20. The device fabrication method of claim 19, further comprising:
    removing the protection layer subsequent to performing fluid-assisted interfacial debonding.

21. The device fabrication method of claim 13, wherein the stack of device layers corresponds to one of an electronic device, an optoelectronic device, and a magnetic device, and has a device area of at least 0.05 $cm^2$.

* * * * *